United States Patent

Bacher et al.

[15] 3,683,245

[45] Aug. 8, 1972

[54] HERMETIC PRINTED CAPACITOR

[72] Inventors: Rudolph John Bacher, New Castle; Takashi Nakayama, Wilmington, both of Del.

[73] Assignee: E. I. du Pont de Nemours and Company, Wilmington, Del.

[22] Filed: Dec. 1, 1971

[21] Appl. No.: 203,777

[52] U.S. Cl. ....................................317/261, 317/242
[51] Int. Cl. ................................................H01g 1/14
[58] Field of Search.........................................317/261

[56] References Cited

UNITED STATES PATENTS 3,267,342 8/1966 Pratt......................317/261 X

*Primary Examiner*—E. A. Goldberg
*Attorney*—Richard H. Burgess

[57] ABSTRACT

A printed capacitor is made hermetic by providing a hole through the substrate to permit electrical connection of the bottom electrode to the opposite side of the substrate, thereby allowing the top electrode to seal completely to the substrate and to be hermetically sealed by a solder coating. Preferred embodiments provide a second hole through the substrate permitting both of the electrical connections to be on the same side of the substrate.

7 Claims, 6 Drawing Figures

HERMETIC PRINTED CAPACITOR

BACKGROUND OF THE INVENTION

This invention relates to electrical capacitors. More specifically, it relates to thick film electrical capacitors produced by printing a conductor, dielectric material and another conductor on a non-conducting substrate.

Thick film capacitors compatible with thick film conductors and resistors have been developed for use in hybrid circuits in the last decade. Because of distinctively different requirements as the circuit element, two kinds of thick film capacitors are now in use. One type has high Q (quality factor), low K (dielectric constant) and low TCC (temperature coefficient of capacitance) and is used for rather high frequencies and for tuning devices. The other type has high K and low Q values as is used for rather low frequencies and for by-pass devices.

The dielectric material for the high Q, low K capacitors is generally glass or a partially crystallized glass, having relatively high density and low porosity. In contrast, the ferro-electric ceramic material used generally for high K capacitors is relatively less dense and more porous, therefore more sensitive to moisture. Relatively low sintering temperatures are used in belt furnaces for economical continuous production. Although somewhat higher densities could be achieved by higher temperature batch sintering, sensitivity to moisture due to some porosity would still generally be a problem.

A nearly hermetic printed capacitor is disclosed in German Pat. publication (Auflegungschrift) No. 1,936,367 - Bergmann in which a thick-film capacitor is provided on an insulating substrate with a first conductor or electrode covered by a dielectric, which in turn is covered by a second electrode. However, it is necessary for the dielectric to protrude out from under the second electrode slightly to cover an electrical in-lead and prevent its electrical shorting to the second electrode. The second electrode is then covered with solder which increases the hermeticity of the capacitor. Thus, the dielectric layer is completely sealed from exposure to moisture except for the place where it covers the electrical in-lead.

U.S. Pat. No. 3,267,342 teaches a hermetic printed capacitor construction which utilizes a glaze of insulating glass over the capacitor elements. However, a buffer layer is needed between the glaze and the top electrode to prevent deleterious action of the glaze on the top electrode when it is being fired. A conductive material such as solder which is compatible with the electrode materials cannot be used economically because it would cause shorting between the electrodes.

It is desirable to have a thick film electrical capacitor which is completely hermetically sealed and which can be produced at low cost.

SUMMARY OF THE INVENTION

The present invention, in certain of its embodiments, provides a capacitor coated or printed on an insulating substrate such as alumina ceramic comprising a first electrode coated on the substrate, dielectric material coated over the first electrode, a second electrode coated over the dielectric material, and a hole having conducting means through the substrate from the first electrode to the opposite side of the substrate. The outer electrode, conductors and contacts are coated with solder to provide the hermeticity and increase ruggedness. Preferred embodiments include the use of second hole through the substrate having conducting means so that the electrical connections to the capacitor can both be made either on the capacitor side or the opposite side of the substrate.

DETAILED DESCRIPTION OF THE PREFERRED EMBODIMENT

The design of the present invention provides hermetically sealed thick film printed capacitors by economically avoiding the difficulties otherwise encountered in the prevention of electrical shorting between the top and bottom electrodes of the capacitor. It does so without leaving any of the relatively porous dielectric material exposed to moisture or the atmosphere by providing a hole through the substrate for electrical connection to the bottom electrode.

Figure 1:
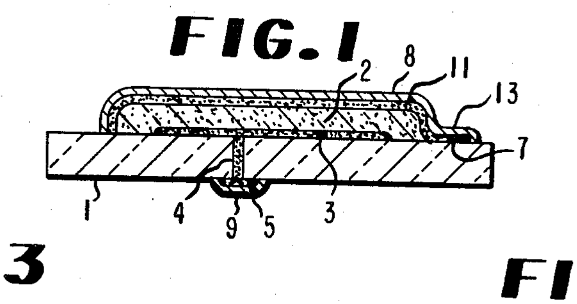
FIG. 1 is an elevation view in cross section of a generic form of the invention.

Turning now to the drawings, FIG. 1 illustrates the generic embodiment of the invention in which first electrode 3 is coated on substrate 1, dielectric material 2 is coated on first electrode 3, second electrode 11 is coated as a metallization on dielectric material 2, and solder layer 8 seals over the top of the capacitor layers. The coating can be done in various ways such as by silk screening. It will be seen from the drawing that dielectric material 2 covers over and around the edges of first electrode 3 to prevent its electrical shorting to second electrode 11. Solder coating 8 seals the assembly to substrate 1, preventing access of moisture to dielectric material 2. Due to some slight moisture permeability of second electrode 11, solder layer 8 is particularly important as a moisture barrier. Hole 4 through substrate 1 can be filled with a metal paste of the same type as used for thick film printed electrodes 3 and 11 to establish an electrical connection to the opposite side of substrate 1. A small coated layer of conductive material forms electrical contact 5, which is sealed by solder at 9, completing the electrical connection on the bottom of substrate 1. The first connection may, of course, be made anywhere on the soldercoated top of the capacitor. Preferably, tab 7 of the conductive material is provided on substrate 1 and over-coated with solder as shown at 13 for making the other electrical connection to the capacitor.

Figure 2:
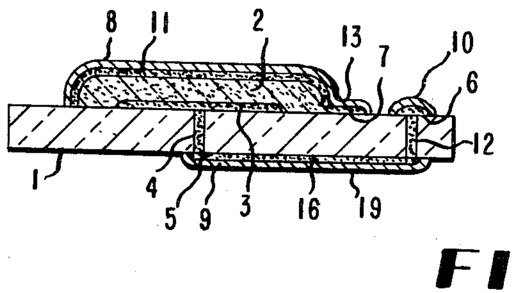
FIG. 2 is an elevation view in cross section of a preferred embodiment of the invention.
Figure 3:
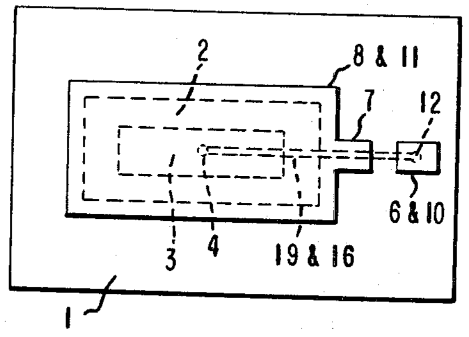
FIG. 3 is a plan view of the capacitor of FIG. 2.

FIGS. 2 and 3 show a similar capacitor in which the electrical connections to first electrode 3 are brought up to the top of substrate 1 by continuing conductor 16 and its solder coating 17 along the bottom of substrate 1 to another hole 12, which penetrates through substrate 1 in an area separated from the capacitor itself. Hole 12 preferably terminates in an electrical contact 6 which has been coated with solder 10.

Figure 4:
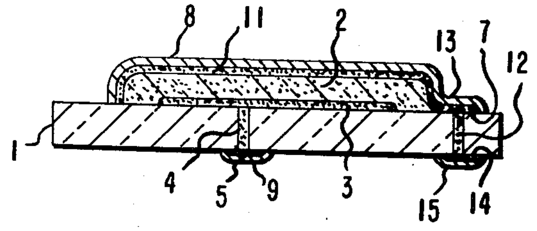
FIG. 4 is an elevation view in cross section of another preferred embodiment of the invention.
Figure 5:
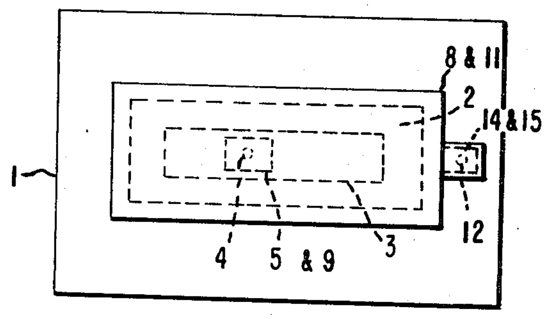
FIG. 5 is a plan view of the capacitor of FIG. 4.

FIGS. 4 and 5 show another preferred embodiment of the invention in which the electrical contacts are both made on the bottom of substrate 1. As can be seen, the structure is quite similar to that of FIG. 1 except that the electrical contact to the top or second electrode is taken through hole 12 to electrical contact 14 with its overlayer of solder 15 on the opposite side of substrate 1.

Figure 6:
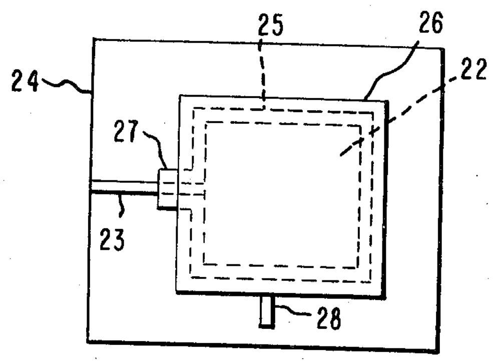
FIG. 6 PRIOR ART
FIG. 6 is a plan view of a capacitor of prior art.

FIG. 6 illustrates a capacitor of prior art which is nearly hermetic in which substrate 24 is coated with first electrode 22, which in turn is coated with dielectric 25 and second electrode 26. Tab 27 of dielectric material covers contact 23 to first electrode 22 to prevent its electrical shorting to second electrode 26. Electrical contact 28 is provided for second electrode 26, which may be coated with solder. Tab 27 is the point at which moisture has access to the dielectric material 25. If the temperature or moisture ambients are high enough or porosity of dielectric material 25 is low enough, this could diminish the utility of the capacitor.

A suitable process for producing the capacitors of the present invention in the embodiment of FIGS. 2 and 3 is as follows:

Bottom electrode 3 and contact 6 are printed and fired at 800°–1,000° C., depending upon the electrode composition. A suitable electrode and conductor composition is 22 percent Pd, 40 percent Ag, 13 percent $Bi_2O$, 3.3 percent of a glass frit, and the balance a suitable inert vehicle. The glass frit is composed of:

63.1 percent CdO 16.9 percent $B_2O_3$ 12.7 percent $SiO_2$ 7.3 percent $Na_2O$

All percentages and proportions herein are by weight except where indicated otherwise. Many suitable inert vehicles are well known in the art and do not affect operation of the finished device.

Holes 4 and 12 are filled with conductor composition and conductor 16 is printed on the bottom side of substrate 1 and fired again at 800°–1,000° C.

Dielectric layer 2 is then printed on the first electrode and dried, then second electrode 11 is printed and fired at 800°–1,100° C., depending on the recommended temperature for the dielectric. A suitable dielectric composition known as K1200 is 74 percent $BaTiO_3$, 2 percent $F_2O_3$, 4 percent glass frit and 20 percent inert vehicle, using a glass frit having the composition:

82 percent $Bi_2O_3$ 11 percent PbO 3.5 percent $B_2O$ 3.5 percent $SiO_2$

The assembly is then dipped into a solder bath to tin the exposed metallizations.

Analogous processes may be used to produce the capacitors of FIGS. 1 and 4 and 5, as illustrated by a description of the process used to make capacitors of FIGS. 4 and 5:

First electrode 3 is printed and then fired as described above.

Holes 4 and 12 are filled with the conductor composition, and then termination pads 5 and 14 are printed, and the assembly again fired.

Dielectric layer 2 is printed and dried on the fired first electrode 3, and second electrode 11 is printed and then fired at the firing temperature recommended for the dielectric.

Finally, the assembly is dipped into a solder bath to tin the exposed metallization and produce complete hermeticity. A suitable solder bath comprises 62 percent Sn, 36 percent Pd and 2 percent Ag.

Examples of capacitors made according to the invention will now be described to demonstrate the hermeticity obtained by use of the invention.

EXAMPLE 1

A capacitor of the type shown in FIGS. 4 and 5 was produced on a conventional 96 percent alumina substrate 25 mils thick using for the electrodes, conductors and holes the above-described commercial conductor composition of 22 percent Pd, 40 percent Ag and using the above-described dielectric K1200. The dielectric was fired to a thickness of 1.8 mils in 10 minutes at 1,050° C. The diameter of the holes was 10 mils and the dielectric area was about 0.22 × 0.27 inches with the second electrode extending 20 mils around the dielectric area. A solder of 62 percent Sn, 36 percent Pb and 2 percent Ag was applied at 215° C.

The capacitor was cycled between 25 and 60° C. at 95 percent relative humidity with 2 volts direct current applied across the electrodes. The capacitance in picofarads, C (pF), dissipation factor, DF (%), at one kilohertz, and the insulation resistance, IR( $\times 10^9\Omega$), at 100 volts DC were recorded.

| Hrs. | C(pF) | DF(%) | IR ($\times 10^9\Omega$) |
|---|---|---|---|
| 0 | 3930 | 3.3 | 6 |
| 17 | 3760 | 2.5 | 6 |
| 47 | 3720 | 2.3 | 1 |
| 103 | 3680 | 2.6 | 1 |
| 127 | 3590 | 2.4 | 1 |
| 168 | 3620 | 2.7 | 20 |

If the dielectric were not hermetically sealed, these DF values would go up substantially and the IR values would go down at least a few orders of magnitude, but the above data show that the DF and IR stay essentially constant within the limits of experimental error.

EXAMPLE 2

The samples here were made in the same way as in Example 1 except the dielectric used was K2000 instead of K1200. K2000 has a composition of 1 percent $ZrO_2$, 73 percent $BaTiO_3$, 2 percent $Fe_2O_3$, 4 percent glass frit and 20 percent vehicle. The same glass frit composition is used in K1200 and K2000. Five samples made without soldering failed after 47 hours, whereas five other soldered samples passed the test with the insulation resistance maintained over $10^9\Omega$ after 168 hours.

EXAMPLE 3

The samples were made in the same way as in Example 1 except the dimension of dielectric layer was 0.280 inch × 0.120 inch. The capacitors were dropped into boiling water and any change in certain electrical parameters was observed.

| Before boiling water test: | C(pF) | DF(%) |
|---|---|---|
| Unsoldered capacitor | 2220 | 4.9 |
| Soldered capacitor | 1824 | 1.6 |
| After 10 minutes in boiling water: | | |
| Unsoldered capacitor | 5400 | more than 150 |
| Soldered capacitor | 1920 | 2.1 |

This example shows clearly that soldering protects the dielectric from water and that the dielectric is sensitive to moisture.

PROCEDURE I

In order to demonstrate the effect of soldering, the capacitor was made exactly in the same way as Example 1 except the exposed metallization was not soldered. By the same test conditions, 3 out of 5 sample capacitors shorted in the first 17 hours.

PROCEDURE II

In order to compare the soldering with organic encapsulation, the sample capacitor made in the same was as Example 1 except that it was coated by polyimide rather than by solder. The same test conditions were applied. After 17 hours, 3 out of 5 samples shorted, and all 5 samples shorted after 47 hours.

What is claimed is:

1. In a hermetically sealed electrical capacitor comprising a nonconductive substrate, a first electrode coated on a first side of said substrate, a dielectric layer coated on and completely overlapping said first electrode, a second electrode coated on said dielectric layer, and a layer of solder on said second electrode, the improvement comprising:

a. said dielectric layer being completely covered with said second electrode, b. said second electrode being completely covered with solder, sealing it to said substrate, and c. at least one hole being provided through said substrate and connecting to said first electrode, with electrically conductive means provided through said hole for electrically connecting to said first electrode from the side of said substrate opposite to said first side.

2. An electrical capacitor according to claim 1 in which there is also provided another hole through said substrate at a location separated from said conductive and dielectric coatings, with electrically conductive means between said hole and said other hole, electrically conductive means through said other hole, and electrical contact means at the end of said other hole on said first side of said substrate, to permit electrical contact to both said first electrode and said second electrode from said first side of said substrate.

3. An electrical capacitor according to claim 2 in which the exposed surfaces of said electrically conductive means and said electric contact means are completely covered with solder, sealing them to said substrate.

4. An electrical capacitor according to claim 2 in which said dielectric material is sensitive to moisture and in which said electrode, electrically conductive means and electrode means are sintered metal powder and glass frit.

5. An electrical capacitor according to claim 1 in which another hole is provided through said substrate electrically connecting with said second electrode, with electrically conductive means through said other hole and electrical contact means at the end of said other hole on said opposite side of said substrate, to permit electrical contact with both said first electrode and said second electrode from said opposite side of said substrate.

6. An electrical capacitor according to claim 5 in which the exposed surfaces of said electrical contact means are completely covered with solder, sealing them to said substrate.

7. An electrical capacitor according to claim 5 in which said dielectric material is sensitive to moisture and in which said electrode, electrically conductive means and electrode means are sintered metal powder and glass frit.

* * * * *